(12) United States Patent  
Kwon et al.

(10) Patent No.: US 8,759,665 B2
(45) Date of Patent: Jun. 24, 2014

(54) SOLAR CELL APPARATUS USING MICROLENS AND METHOD FOR MANUFACTURING SAME

(75) Inventors: Sunghoon Kwon, Seoul (KR); Junhoi Kim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 660 days.

(21) Appl. No.: 12/919,962

(22) PCT Filed: Feb. 18, 2009

(86) PCT No.: PCT/KR2009/000752
§ 371 (c)(1),
(2), (4) Date: Nov. 24, 2010

(87) PCT Pub. No.: WO2009/107943
PCT Pub. Date: Sep. 3, 2009

(65) Prior Publication Data
US 2011/0061717 A1 Mar. 17, 2011

(30) Foreign Application Priority Data
Feb. 28, 2008 (KR) .................. 10-2008-0018150

(51) Int. Cl.
*H01L 31/052* (2014.01)
*H01L 31/18* (2006.01)
*H01L 31/048* (2014.01)

(52) U.S. Cl.
CPC .......... *H01L 31/0524* (2013.01); *H01L 31/048* (2013.01); *Y02E 10/52* (2013.01)
USPC ............ 136/246; 136/243; 136/244; 136/251

(58) Field of Classification Search
USPC .................................. 136/243–252
See application file for complete search history.

(56) References Cited

U.S. PATENT DOCUMENTS

| 3,473,032 A * | 10/1969 | Lehovec ......................... 250/552 |
| 2004/0112424 A1 * | 6/2004 | Araki et al. .................... 136/256 |
| 2005/0081908 A1 * | 4/2005 | Stewart .......................... 136/246 |
| 2008/0210288 A1 * | 9/2008 | Nakatani et al. ............... 136/244 |
| 2009/0025780 A1 * | 1/2009 | Nakata ........................... 136/250 |
| 2009/0126794 A1 * | 5/2009 | Dimroth et al. ................ 136/259 |
| 2009/0277493 A1 * | 11/2009 | Merkle .......................... 136/246 |

FOREIGN PATENT DOCUMENTS

| JP | 2005-142285 | 6/2005 |
| JP | 2005-142373 | 6/2005 |
| JP | 2005-285948 | 10/2005 |
| WO | WO 2006128417 A1 * | 12/2006 |
| WO | WO 2007091294 A1 * | 8/2007 |
| WO | WO 2007093422 A1 * | 8/2007 |

* cited by examiner

*Primary Examiner* — Jennifer Michener
*Assistant Examiner* — Matthew Martin
(74) *Attorney, Agent, or Firm* — Sherr & Jiang, PLLC

(57) ABSTRACT

Provided are a solar cell apparatus and a method of manufacturing the same. More particularly, a high efficiency, inexpensive and large-area solar cell apparatus using a microlens, and a method of manufacturing the same are provided. The solar cell apparatus includes a plate on which a plurality of lenses are arranged on one surface, and a plurality of solar cells receiving light concentrated by the lenses.

10 Claims, 12 Drawing Sheets

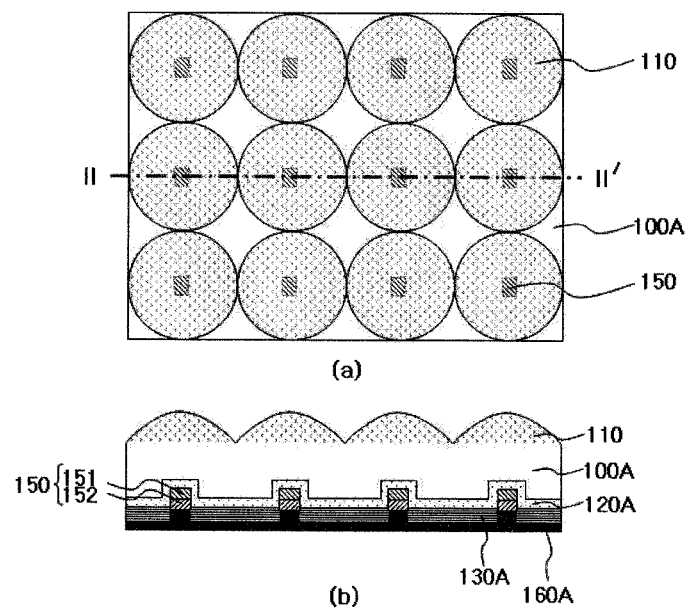
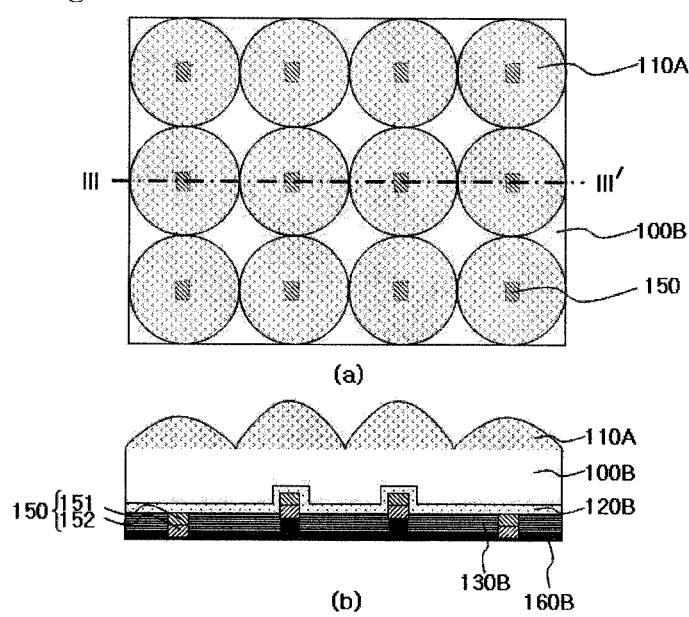

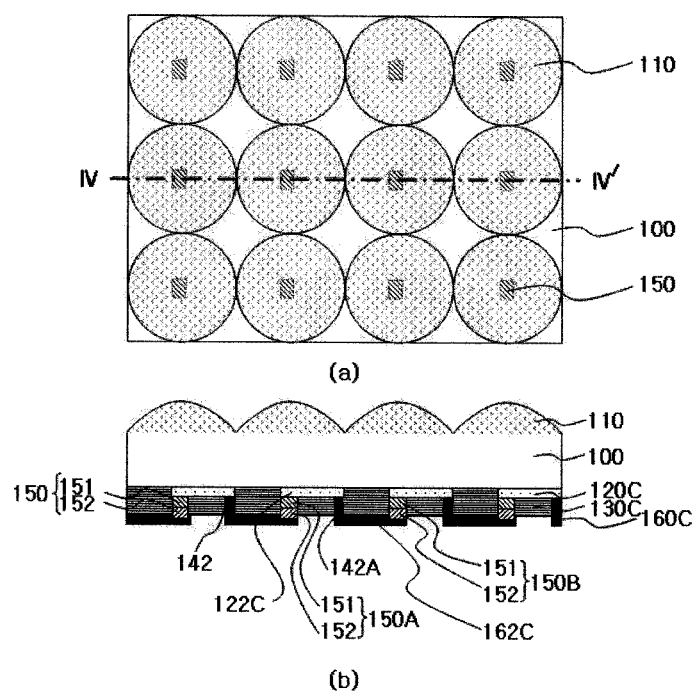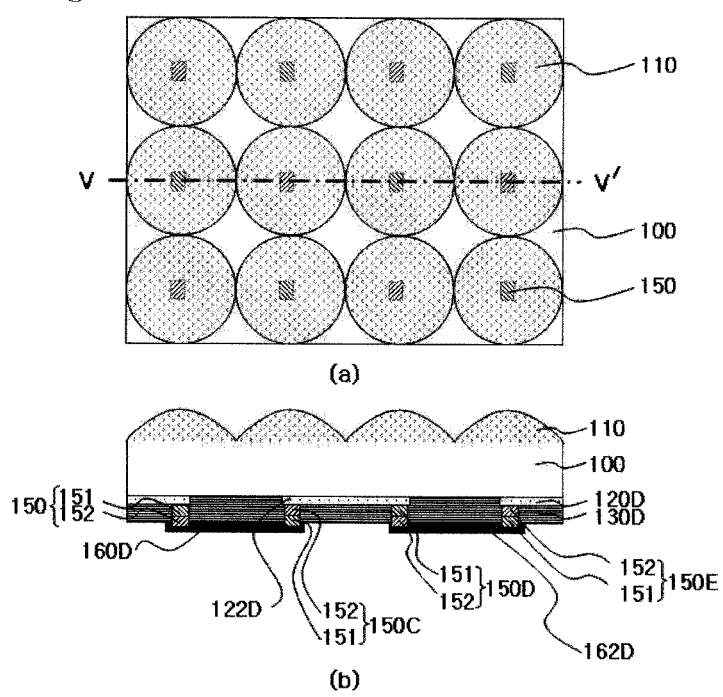

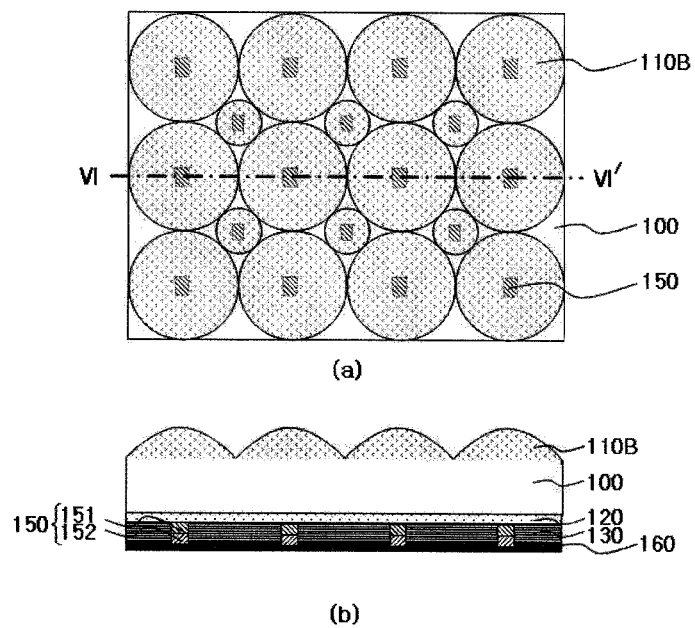
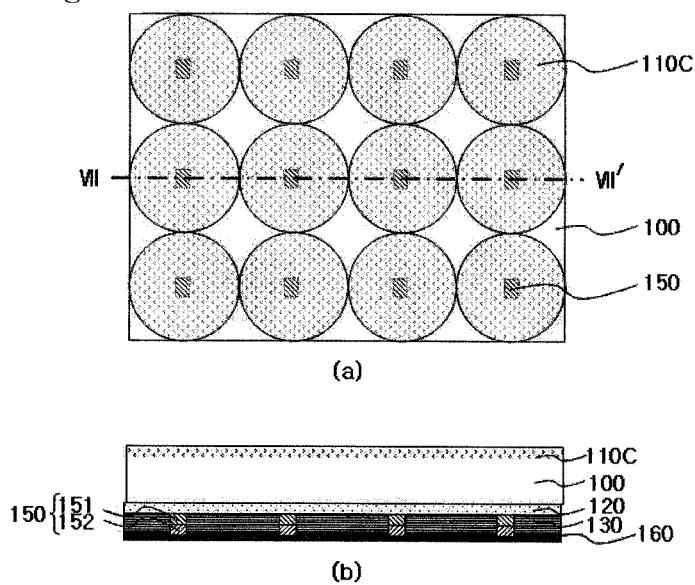

Fig 8
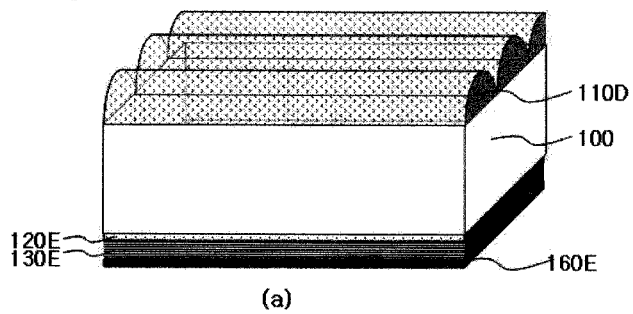
(a)
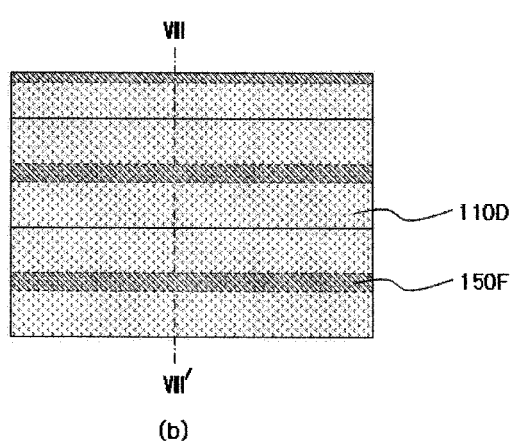
(b)
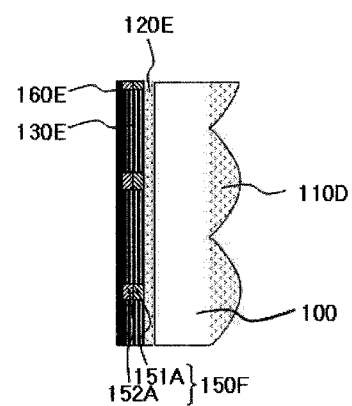
(c)
Fig 9
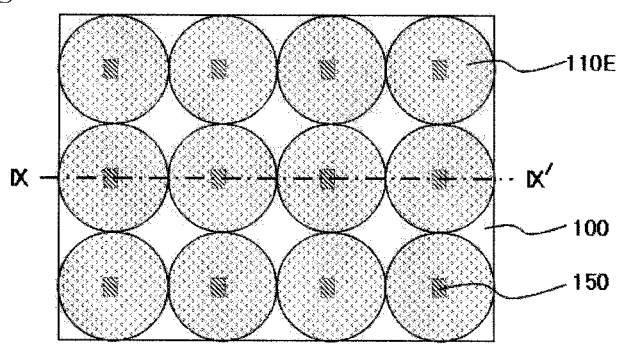
(a)
(b)

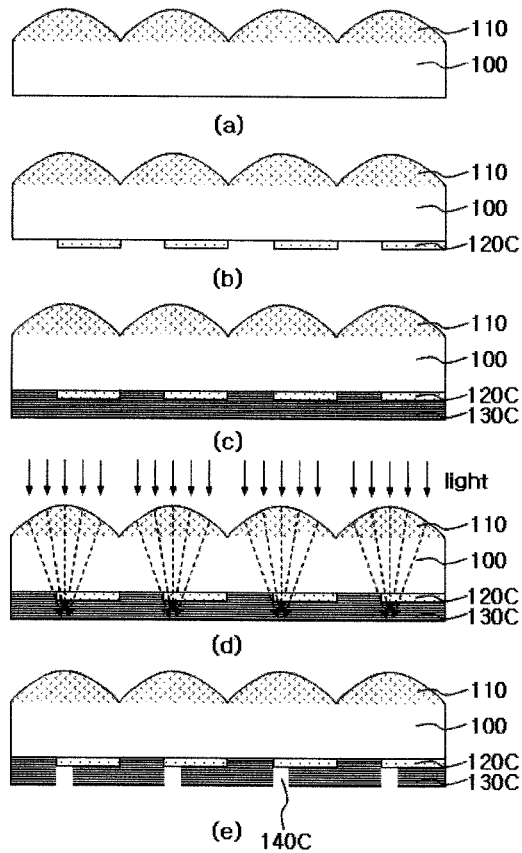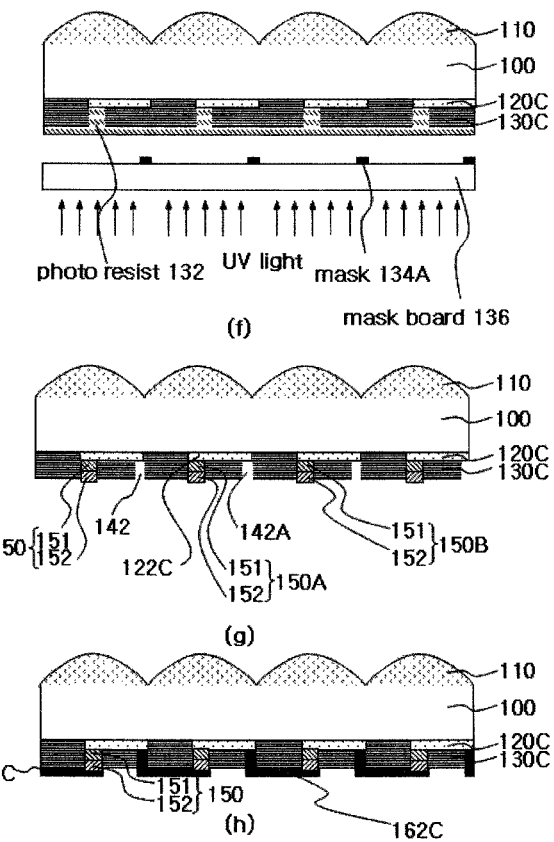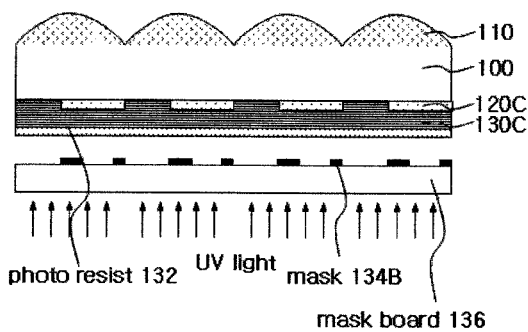

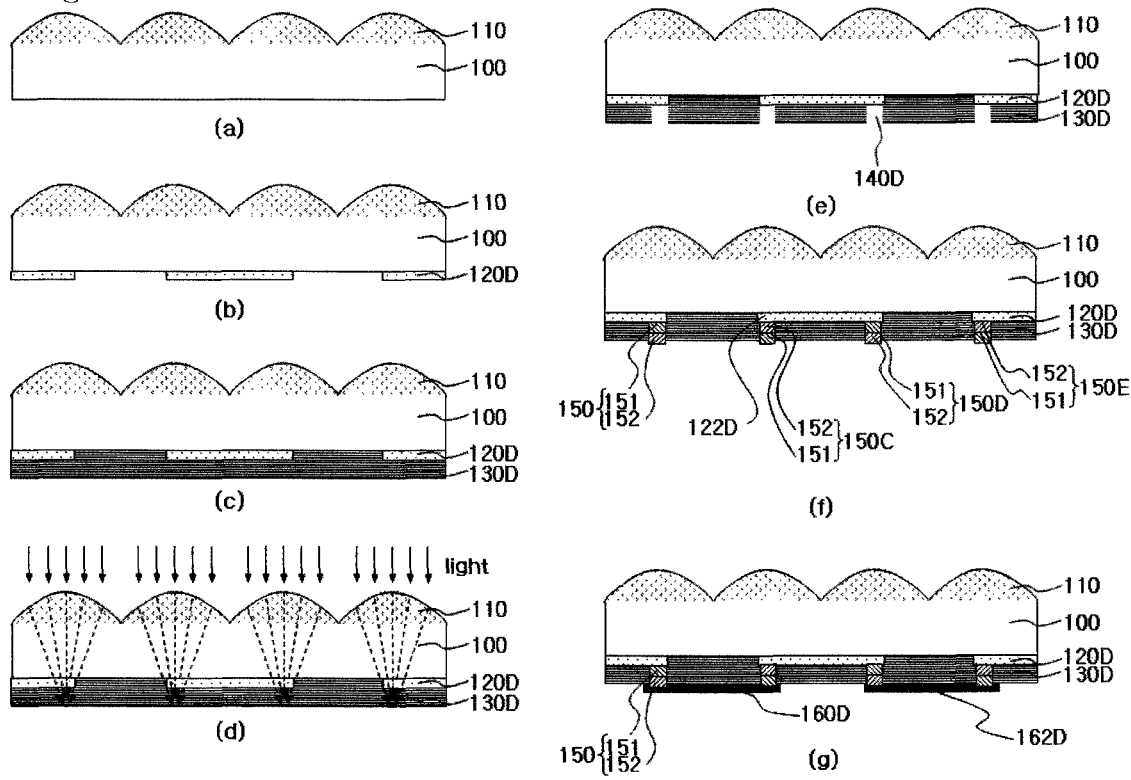
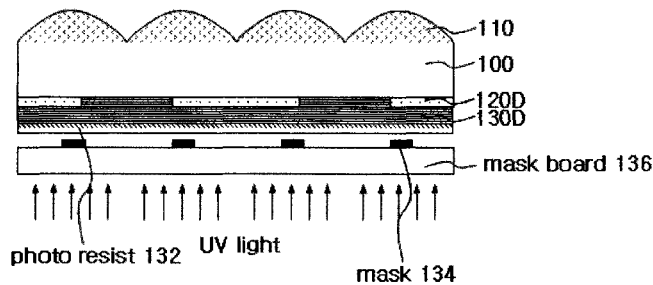

SOLAR CELL APPARATUS USING MICROLENS AND METHOD FOR MANUFACTURING SAME

CROSS REFERENCE TO PRIOR APPLICATIONS

This application is a National Stage Patent Application of International Patent Application No. PCT/KR2009/000752 (filed on Feb. 18, 2009) under 35 U.S.C. §371, which claims priority to Korean Patent Application No. 10-2008-0018150 (filed on Feb. 28, 2008), which are both hereby incorporated by reference in their entirety.

TECHNICAL FIELD

The present invention relates to a solar cell apparatus and a method of manufacturing the same, and more particularly, to a highly-efficient, inexpensive and large-area solar cell apparatus using a microlens and a method of manufacturing the same.

BACKGROUND ART

Conventional solar cells are classified into inorganic solar cells and organic solar cells. The inorganic solar cells are formed of single crystalline silicon or polysilicon. The inorganic solar cells have high efficiency, but are difficult to realize with a large area and are expensive. On the other hand, the organic solar cells are easily realized with a large area and are inexpensive, but have low efficiency.

DISCLOSURE

Technical Problem

The present invention is directed to a highly-efficient, inexpensive and large-area solar cell apparatus and a method of manufacturing the same.

The present invention is also directed to a method of manufacturing a solar cell apparatus on a large scale.

Technical Solution

One aspect of the present invention provides a solar cell apparatus, including: a plate on which a plurality of lenses are arranged on a surface; and a plurality of solar cells receiving light concentrated by the plurality of lenses.

Another aspect of the present invention provides a method of manufacturing a solar cell apparatus, including: (a) preparing a plate on which a plurality of lenses are arranged on one surface; and (b) arranging a plurality of solar cells on the other surface of the plate.

Still another aspect of the present invention provides a solar cell apparatus, including: a plurality of light concentrating means; and solar cells receiving light concentrated by the light concentrating means.

Yet another aspect of the present invention provides a fluidic self-assembly method, including: (a) preparing a plate on which a plurality of first recesses having a first shape and a plurality of second recesses having a second shape are formed on a surface, and (b) arranging first electronic devices having a third shape corresponding to the first shape and second electronic devices having a fourth shape corresponding to the second shape on the other surface of the plate.

Advantageous Effects

As described above, a solar cell apparatus and a method of manufacturing the same provide high efficiency, low production costs, and a large area.

According to the solar cell apparatus and the method of manufacturing the same, a plurality of small solar cells can be precisely assembled on a focus of a plurality of lenses.

The solar cell apparatus and the method of manufacturing the same have a processing advantage of forming spaces for a plurality of solar cells by exposure of light passing through a plurality of lenses without a separate mask.

The solar cell apparatus and the method of manufacturing the same also have a processing advantage of easily arranging the small solar cells by fluidic self-assembly.

The solar cell apparatus and the method of manufacturing the same use a plate formed of a flexible polymer or a polymer compound. The solar cell apparatus manufactured using the plate can be easily installed without regard to a location and a space.

Further, according to the solar cell apparatus and the method of manufacturing the same, the solar cell apparatus has higher energy conversion efficiency using the characteristic of the solar cell in which energy conversion efficiency is further increased when light is concentrated.

DESCRIPTION OF DRAWINGS

FIG. 2 shows a solar cell apparatus according to a second exemplary embodiment of the present invention;

FIG. 3 shows a solar cell apparatus according to a third exemplary embodiment of the present invention;

FIG. 4 shows a solar cell apparatus according to a fourth exemplary embodiment of the present invention;

FIG. 5 shows a solar cell apparatus according to a fifth exemplary embodiment of the present invention;

FIGS. 6 to 9 show modified examples of a plurality of lenses arranged on a plate shown in each of FIGS. 1 to 5;

FIG. 19 shows a method of manufacturing the solar cell apparatus according to the fourth exemplary embodiment of the present invention;

FIG. 20 shows a modified example of (d) to (f) of FIG. 19;

FIG. 21 shows a method of manufacturing the solar cell apparatus according to the fifth exemplary embodiment of the present invention;

FIG. 22 shows a modified example of (d) of FIG. 21; and

MODE FOR INVENTION

Figure 1:
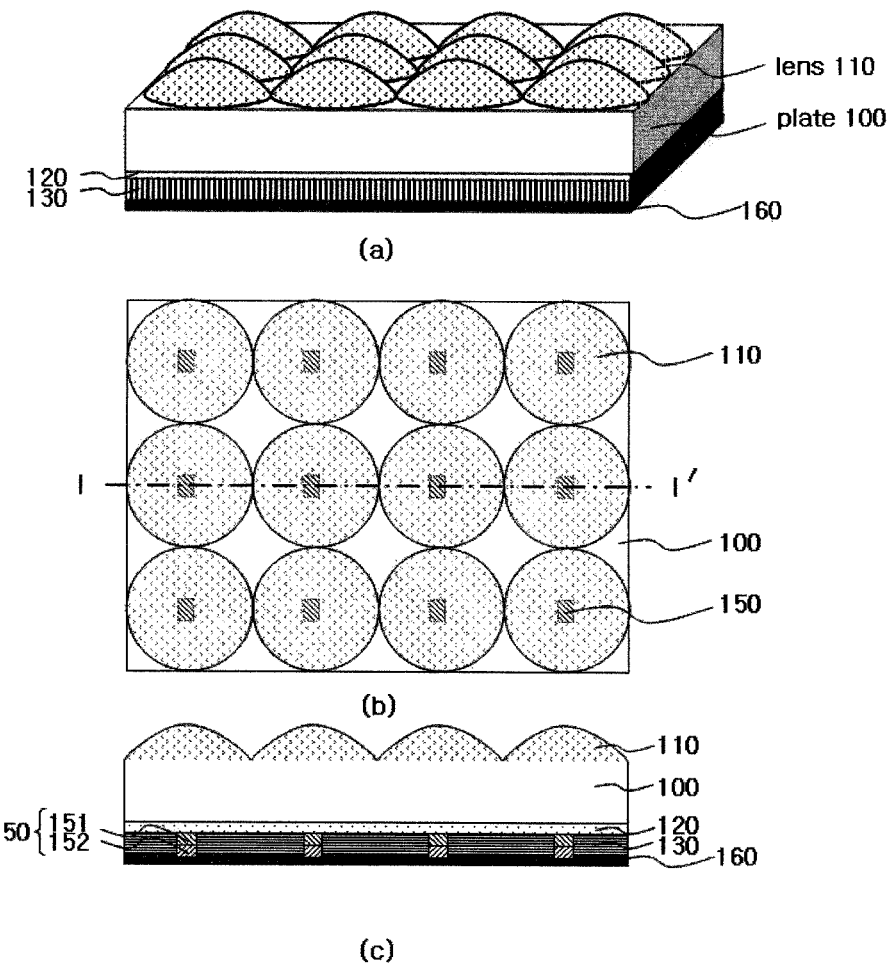
FIG. 1 shows a solar cell apparatus according to a first exemplary embodiment of the present invention.

Hereinafter, exemplary embodiments of the present invention will be described in detail with reference to the accompanying drawings. As long as not clearly stated in the disclosure, like numerals in the drawings denote like elements. However, the exemplary embodiments described in the detailed description, drawings and claims are not provided to limit the present invention, and thus different exemplary embodiments can be used. The exemplary embodiments may also be modified without departing the scope of the present invention. It should be easily understood by one of ordinary skill in the art that the elements of the present invention, that is, the elements generally described and shown in the drawings may be arranged, configured, connected and designed in various types, there are all clearly invented, and incorporated into the present invention as a part.

When an element or layer is formed "on" another element or layer, the element or layer may be directly formed on another element or layer, or an additional element or layer may be interposed between them.

FIG. 1 shows a solar cell apparatus according to a first exemplary embodiment of the present invention. (a), (b) and (c) of FIG. 1 are isometric, plan and cross-sectional views of the solar cell apparatus, respectively.

Referring to FIG. 1, the solar cell apparatus includes a plate 100 on which microlenses 110 are arranged, and solar cells 150. The solar cell apparatus may further include a first electrode 120, an insulating layer 130 and a second electrode 160. In the solar cell apparatus, the solar cells arranged in the same polarity direction are electrically connected in parallel.

The plate 100 may be farmed of one of various materials having light transmission properties, for example, glass or a polymer compound such as a polymer.

The microlenses 110 are composed of convex lenses formed of a light transmitting material. The light transmitting material may be glass or a polymer compound such as a polymer. In the exemplary embodiment, the plurality of lenses 110 are convex lenses having the same size, but if the convex lenses have similar focal distances, the lenses may have different shapes. Further, there is no size limit for the lenses.

The first electrode 120 may be formed of various conductive metals or conductive organic compounds such as a conductive polymer. The first electrode 120 may have light transmission properties. In this case, the first electrode having light transmission properties may be formed of a conductive polymer linked with indium-tin-oxide (ITO) or carbon nanotubes.

The insulating layer 130 may be formed of one of various nitride layers, oxide layers or organic compounds having electrical insulation properties. The insulating layer 130 electrically isolates the first electrode 120 from the second electrode 160. In addition, the insulating layer 130 ensures spaces for respective solar cells 150.

The solar cells 150 may be organic or inorganic solar cells. Examples of the organic solar cells may include solar cells formed of light absorbing dyes or organic nanoparticles, organic solar cells and polymer solar cells. Examples of inorganic solar cells may include solar cells formed of inorganic single crystalline, inorganic polycrystalline, and inorganic amorphous materials, and inorganic nanoparticles. In detail, the plurality of solar cells may be formed of single crystalline silicon, polycrystalline silicon, amorphous silicon, cadmium telluride (CdTe), copper indium selenide ($CuInSe_2$), gallium arsenide (GaAs), germanium (Ge) or gallium indium phosphide ($GaInP_2$). When the solar cell is formed of an inorganic single crystalline material, it has the maximum efficiency of 25%, but has a size limit and is expensive. However, according to the exemplary embodiment, as the number of required solar cells may be reduced by concentrating solar light using a plurality of convex lenses, the large-area, highly efficient and inexpensive solar cell apparatus can be manufactured using the minimum number of solar cells formed of an inorganic single crystalline material. In the exemplary embodiment, the solar cells 150 having a P(151)-N(152) junction are shown, but the solar cells may be formed in a different type. In accordance with the P(151)-N(152) junction solar cells of the exemplary embodiment, the P type 151 is connected to the first electrode, but if the polarity directions of the solar cells are the same, the N type 152 may be connected to the first electrode.

The second electrode 160 may be formed of various conductive metals or conductive organic compounds such as a conductive polymer. The second electrode 120 may have light transmission properties. In this case, the second electrode having light transmission properties may be formed of a conductive polymer linked with ITO or carbon nanotubes. The second electrode 120 is used to electrically connect the solar cells 150 along with the first electrode 120.

FIG. 2 shows a solar cell apparatus according to a second exemplary embodiment of the present invention. (a) and (b) of FIG. 2 are plan and cross-sectional views of the solar cell apparatus, respectively.

Since the height of a plate 100A is greater than focal distances of a plurality of lenses 110, recesses are formed in an opposite surface of the surface of the plate 100A on which the plurality of lenses 110 are formed, thereby effectively transferring concentrated light to solar cells 150. In the exemplary embodiment, the plurality of lenses 110 are composed of convex lenses having the same size. However, if the convex lenses have similar focal distances, the lenses may have different shapes, and there is no size limit for the lenses. In accordance with the solar cells 150 of the exemplary embodiment, a P type 151 is connected to a first electrode 120A. However, if the polarity directions of the solar cells are equal, an N type 152 may be connected to the first electrode 120A. The plate 100A may be formed of various materials having light transmission properties. The material may include glass or a polymer compound such as a polymer. Meanwhile, the other characteristics of the components are the same as described in the first exemplary embodiment.

FIG. 3 shows a solar cell apparatus according to a third exemplary embodiment of the present invention. (a) and (b) of FIG. 3 are plan and cross-sectional views of the solar cell apparatuses, respectively.

Since focal distances of at least some lenses 110A are greater than that of a plate 100B, recesses are formed in some parts of an opposite surface of the surface of the plate 100B on which the plurality of lenses 110A are formed, thereby effectively transferring concentrated light to solar cells 150. In the exemplary embodiment, the plurality of lenses 110A are composed of convex lenses having different sizes. However, if the convex lenses have similar focal distances, the lenses may have the same shape, and there is no size limit for the lenses. In accordance with the solar cells 150 of the exemplary embodiment, a P type 151 is connected to a first electrode 120B. However, if the polarity directions of the solar cells are the same, an N type 152 may be connected to the first electrode 120B. The plate 100B may be formed of various materials having light transmission properties. The material may include glass or a polymer compound such as a polymer. Meanwhile, the other characteristics of the components are the same as described in the first exemplary embodiment.

FIG. 4 shows a solar cell apparatus according to a fourth exemplary embodiment of the present invention. (a) and (b) of FIG. 4 are plan and cross-sectional views of the solar cell apparatuses, respectively.

Referring to FIG. 4, the solar cell apparatus includes a plate 100 on which microlenses 110 are arranged, and solar cells 150. The solar cell apparatus may further include a plurality of first electrodes 120C insulated from each other, an insulating layer 130C, and a plurality of second electrodes 160C insulated from each other. In the solar cell apparatus, the solar cells 150 arranged in the same polarity direction are electrically connected in series.

The plurality of first electrodes 120C and the plurality of second electrodes 160C are patterned to electrically connect the solar cells 150 in series, and the insulating layer 130C ensures spaces for the respective solar cells 150 and contact holes 142 which connect the plurality of first electrodes 120C with the plurality of second electrodes 160C.

Among the plurality of solar cells 150, two successive solar cells connected in series refer to a first solar cell 150A and a second solar cell 150B, respectively. The first solar cell 150A is connected by a first electrode 122C of the plurality of first electrodes 120C, and the second solar cell 150B is connected by a second electrode 162C of the plurality of second electrodes 160C. The first and second electrodes 122C and 162C are connected to each other through a corresponding contact hole 142A of the plurality of contact holes 142 such that the solar cells are electrically connected in series.

In the exemplary embodiment, the plurality of lenses 110 are composed of convex lenses having the same size, but if the convex lenses have similar focal distances, the lenses may have different shapes, and there is no size limit for the lenses. In the exemplary embodiment, the plate 100 is the same as that shown in FIG. 1, but may be the same as that shown in FIG. 2 or FIG. 3 (100A or 100B). In the exemplary embodiment, the solar cells 150 are connected one by one in series, but a set of two or more solar cells 150 connected in parallel may be connected to another set in series. In accordance with the solar cells 150 in the exemplary embodiment, P types 151 are connected to the plurality of first electrodes 120C. However, if the polarity directions of the solar cells 150 are the same, N types 152 may be connected to the plurality of first electrodes 120C. Meanwhile, the other characteristics of the components are the same as described in the first exemplary embodiment.

FIG. 5 shows a solar cell apparatus according to a fifth exemplary embodiment of the present invention. (a) and (b) of FIG. 5 are plan and cross-sectional views of the solar cell apparatus, respectively.

Referring to FIG. 5, the solar cell apparatus includes a plate 100 on which microlenses 110 are arranged, and solar cells 150. The solar cell apparatus may further include a plurality of first electrodes 120D insulated from each other, an insulating layer 130D, and a plurality of second electrodes 160D insulated from each other. In the solar cell apparatus, at least some of the solar cells 150 are arranged in different polarity directions, and are electrically connected in series.

The plurality of first electrodes 120D and the plurality of second electrodes 160D are patterned to electrically connect the solar cells 150 in series, and the insulating layer 130D ensures spaces for the respective solar cells 150.

Among the plurality of solar cells 150, two successive solar cells connected in series are arranged in different polarity directions. Three successive solar cells connected in series are referred to as first, second and third solar cells 150C, 150D, and 150E, respectively. Here, the first and second solar cells 150C and 150D are connected by a corresponding first electrode 122D of the plurality of first electrodes 120D, and the second and third solar cells 150D and 150E are connected by a corresponding second electrode 162D of the plurality of second electrodes 160D such that the solar cells 150 arranged in different polarity directions are electrically connected in series.

In the exemplary embodiment, the plurality of lenses 110 are composed of convex lenses having the same size, but if the convex lenses have similar focal distances, the lenses may have different shapes, and there is no size limit for the lenses. In the exemplary embodiment, the plate 100 is the same as that shown in FIG. 1, but may be the same as that shown in FIG. 2 or FIG. 3 (100A or 100B). In the exemplary embodiment, the solar cells 150 are connected one by one in series, but a set of two or more solar cells 150 connected in parallel may be connected to another set in series. Meanwhile, the other characteristics of the components are the same as described in the first exemplary embodiment.

FIGS. 6 to 9 show modified examples of the plurality of lenses arranged on the plate shown in each of FIGS. 1 to 5.

The plurality of lenses are composed of convex lenses, Fresnel lenses, cylinder lenses, or flat panel-type lenses formed of a light transmitting material. The light transmitting material may include glass or a polymer compound such as a polymer.

(a) and (b) of FIG. 6 are plan and cross-sectional views of the solar cell apparatus, respectively. The plurality of lenses 110B are composed of convex lenses, and may have different sizes to increase an effective light receiving area. If the convex lenses have similar focal distances, the lenses may have different shapes, and there is no size limit for the lenses. In the exemplary embodiment, two convex lenses having different sizes are shown, but a set of three convex lenses having different sizes is also applicable. In FIG. 6, the plate 100 is the same as that shown in FIG. 1, but may be the same as that shown in FIG. 2 or FIG. 3 (100A or 100B). In the solar cell apparatus of FIG. 6, the solar cells 150 arranged in the same polarity direction are electrically connected in parallel. However, the solar cells 150 may be arranged in the same polarity direction and electrically connected in series as shown in the fourth exemplary embodiment, or at least some of the solar cells 150 may be arranged in different polarity directions and may be electrically connected in series as shown in the fifth exemplary embodiment. Meanwhile, the other components are the same as described in the first exemplary embodiment.

(a) and (b) of FIG. 7 are plan and cross-sectional views of the solar cell apparatus, respectively. The plurality of lenses 110C are composed of Fresnel lenses having the same size. If the lenses have similar focal distances, the lenses may have different shapes, and there is no size limit for the lenses. In FIG. 7, the plate 100 is the same as that shown in FIG. 1, but may be the same as that shown in FIG. 2 or FIG. 3 (100A or 100B). The plurality of lenses 110C may have at least two different sizes to increase an effective light receiving area. If the focal distances of the lenses are similar, the lenses may have different shapes. In the solar cell apparatus of FIG. 7, the solar cells 150 arranged in the same polarity direction are electrically connected in parallel. However, the solar cells 150 may be arranged in the same polarity direction and electrically connected in series as shown in the fourth exemplary embodiment, or at least some of the solar cells 150 may be arranged in different polarity directions and may be electrically connected in series as shown in the fifth exemplary embodiment. Meanwhile, the other components are the same as described in the first exemplary embodiment.

(a) and (b) of FIG. 8 are plan and cross-sectional views of the solar cell apparatus, respectively. The plurality of lenses 110D are composed of cylinder lenses having the same size. If the lenses have similar focal distances, the lenses may have different shapes, and there is no size limit for the lenses. In FIG. 8, the plate 100 is the same as that shown in FIG. 1, but may be the same as that shown in FIG. 2 or FIG. 3 (100A or 100B). In the solar cell apparatus of FIG. 8, the solar cells 150F arranged in the same polarity direction are electrically connected in parallel. However, the solar cells 150 may be arranged in the same polarity direction and electrically connected in series as shown in the fourth exemplary embodiment, or at least some of the solar cells 150 may be arranged in different polarity directions and may be electrically connected in series as shown in the fifth exemplary embodiment. Meanwhile, the other components are the same as described in the first exemplary embodiment.

(a) and (b) of FIG. 9 are plan and cross-sectional views of the solar cell apparatus, respectively. The plurality of lenses 110E are composed of convex lenses and Fresnel lenses having the same size. If the lenses have similar focal distances, the lenses may have different shapes, and there is no size limit for the lenses. In the exemplary embodiment, the combination of the convex lenses and the Fresnel lenses is used, but any combinations of convex lenses, Fresnel lenses, cylinder lenses, and flat panel-type lenses are available. In FIG. 9, the plate 100 is the same as that shown in FIG. 1, but may be the same as that shown in FIG. 2 or FIG. 3 (100A or 100B). In the solar cell apparatus of FIG. 9, the solar cells 150 arranged in the same polarity direction are electrically connected in parallel. However, the solar cells 150 may be arranged in the same polarity direction and electrically connected in series as shown in the fourth exemplary embodiment, or at least some of the solar cells 150 may be arranged in different polarity directions and may be electrically connected in series as shown in the fifth exemplary embodiment. Meanwhile, the other components are the same as described in the first exemplary embodiment.

Figure 10:
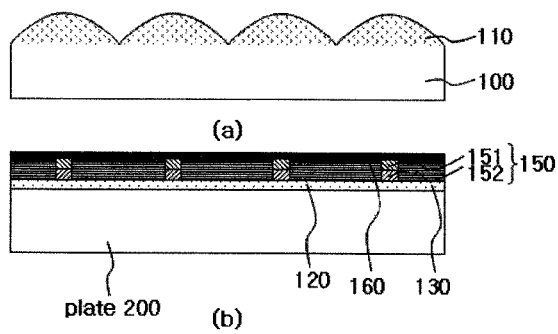
FIGS. 10 to 12 show modified examples of a solar cell apparatus.
Figure 11:
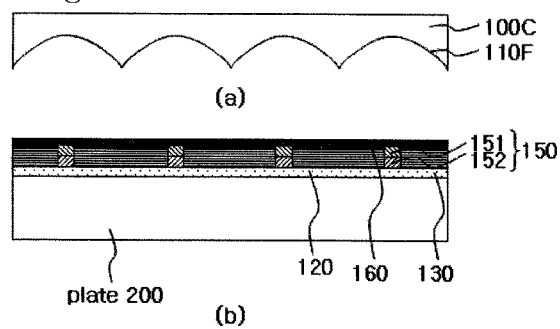
Figure 12:
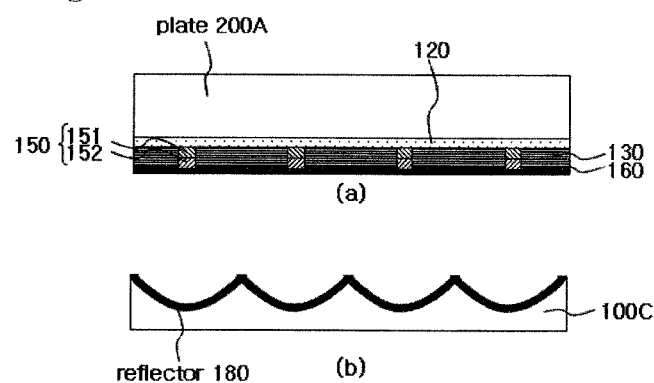

FIGS. 10 to 12 show modified examples of a solar cell apparatus.

The solar cell apparatus includes a first plate on which a plurality of microlenses or micromirrors are arranged, and a second plate on which a plurality of solar cells are arranged.

The plurality of lenses may be composed of convex lenses, Fresnel lenses, cylinder lenses or flat panel-type lenses, which are formed of a light transmitting material. The light transmitting material may include glass or a polymer compound such as a polymer.

The first and second plates may be formed of various materials having light transmission properties. The material may include glass or a polymer compound such as a polymer. The first and second plates may be formed of different materials.

(a) and (b) of FIG. 10 are cross-sectional views of the first and second plates 100 and 200, respectively.

Referring to FIG. 10, the solar cell apparatus includes the first plate 100 on which the microlenses 110 are arranged and the second plate 200 on which the solar cells 150 are arranged.

In (a) of FIG. 10, the first plate 100 is formed and the plurality of lenses 110 are formed on the first plate 100. The plurality of lenses 110 are composed of convex lenses having the same size. If the focal distances of the convex lenses are similar, the lenses may have different shapes, and there is no size limit for the lenses. In (b) of FIG. 10, the second plate 200 is formed and the plurality of solar cells 150 are formed on the second plate 200.

In (a) of FIG. 10, to increase an effective light receiving area, the plurality of lenses 110 may have at least two different sizes. In addition, the plurality of convex lenses 110 may be replaced with Fresnel lenses, cylinder lenses or flat panel-type lenses. The plurality of lenses 110 may be composed of a combination of convex lenses, Fresnel lenses, cylinder lenses and flat panel-type lenses, and have different sizes. If the focal distances of the lenses are similar, the lenses may have different shapes, and there is no size limit for the lenses.

In (b) of FIG. 10, the second plate 200 may further include a first electrode 120, an insulating layer 130, and a second electrode 160. These components are the same as those described in the first exemplary embodiment.

The first and second plates 100 and 200 may be connected by bonding after the height of the first plate 100 is determined such that the focuses of the plurality of convex lenses 110 are placed on the plurality of solar cells 150. The bonding may be performed by bonding using a polymer organic adherent (e.g., epoxy), fusion bonding, anodic bonding, or polymer bonding.

In the solar cell apparatus of FIG. 10, the solar cells 150 arranged in the same polarity direction are electrically connected in parallel. However, the solar cells 150 arranged in the same polarity direction may be electrically connected in series as shown in the fourth exemplary embodiment, or at least some solar cells 150 may be arranged in different polarity directions and may be electrically connected in series as shown in the fifth exemplary embodiment. Meanwhile, the other components are the same as described in the first exemplary embodiment.

(a) and (b) of FIG. 11 are cross-sectional views of first and second plates 100C and 200, respectively. (a) of FIG. 11 shows the plate 100C carved inwardly to serve as a plurality of convex lenses 110F. In (a) of FIG. 11, the plurality of convex lenses 110F having the same size are shown, but if the focal distances of the convex lenses are similar, the lenses may have different shapes, and there is no size limit for the lenses. The plurality of convex lenses 110F may be replaced with cylinder lenses, or a combination of convex lenses and cylinder lenses. To increase an effective light receiving area, the plurality of lenses 110F may have at least two different sizes.

(b) of FIG. 11 shows the second plate 200 and a plurality of solar cells 150 arranged on the second plate 200. In (b) of FIG. 11, the second plate 200 includes the plurality of solar cells 150, which is the same as that of (b) of FIG. 10, but the present invention is not limited thereto. In (b) of FIG. 11, the second plate 200 may further include a first electrode 120, an insulating layer 130, and a second electrode 160. These components are the same as those described in the first exemplary embodiment.

The first and second plates 100C and 200 are connected by bonding described above in the modified example of FIG. 10.

In the solar cell apparatus of FIG. 11, the solar cells 150 arranged in the same polarity direction are electrically connected in parallel, but the solar cells 150 arranged in the same polarity direction are electrically connected in series. However, the solar cells 150 arranged in the same polarity direction may be electrically connected in series as shown in the fourth exemplary embodiment, or at least some solar cells 150 may be arranged in different polarity directions and may be electrically connected in series as shown in the fifth exemplary embodiment. Meanwhile, the other components are the same as described in the first exemplary embodiment.

(a) and (b) of FIG. 12 are cross-sectional views of second and first plates 200A and 100C, respectively. (a) of FIG. 12 shows the second plate 200A and a plurality of solar cells 150 arranged on the second plate 200A. In (a) of FIG. 12, the second plate 200A on which the plurality of solar cells 150 are arranged are shown, which are the same as those in (b) of FIG. 6, but the present invention is not limited thereto. In (a) of FIG. 12, the second plate 200A may further include a first electrode 120, an insulating layer 130, and a second electrode 160. These components are the same as those in the first exemplary embodiment. Meanwhile, the second plate 200A may have light transmission properties. The first electrode 120, the insulating layer 130 and the second electrode 160 may also have light transmission properties.

In (b) of FIG. 12, a reflector 180 is formed on a surface of the first plate 100C after being curved inwardly to implement the same plurality of mirrors. The reflector may be a metal layer. The metal layer may be formed of a silver compound, chromium (Cr), titanium (Ti) or platinum (Pt). (b) of FIG. 12 shows a plurality of concave mirrors 180, but if the focal distances of the concave mirrors 180 are similar, the mirrors may have different shapes, and there is no size limit for the mirrors. The mirrors may be a plurality of concave cylinder-type mirrors, or a combination of a plurality of concave mirrors and a plurality of concave cylinder mirrors. To increase an effective light receiving area, the plurality of mirrors 180 may have at least two different sizes.

The first and second plates 110C and 200A may be connected by bonding as described in the modified example of FIG. 10.

In the solar cell apparatus of FIG. 12, the solar cells 150 arranged in the same polarity direction are electrically connected in parallel. However, the solar cells 150 arranged in the same polarity direction may be electrically connected in series as shown in the fourth exemplary embodiment, or at least some solar cells 150 may be arranged in different polarity directions and may be electrically connected in series as shown in the fifth exemplary embodiment. Meanwhile, the other components are the same as described in the first exemplary embodiment.

Figure 13:
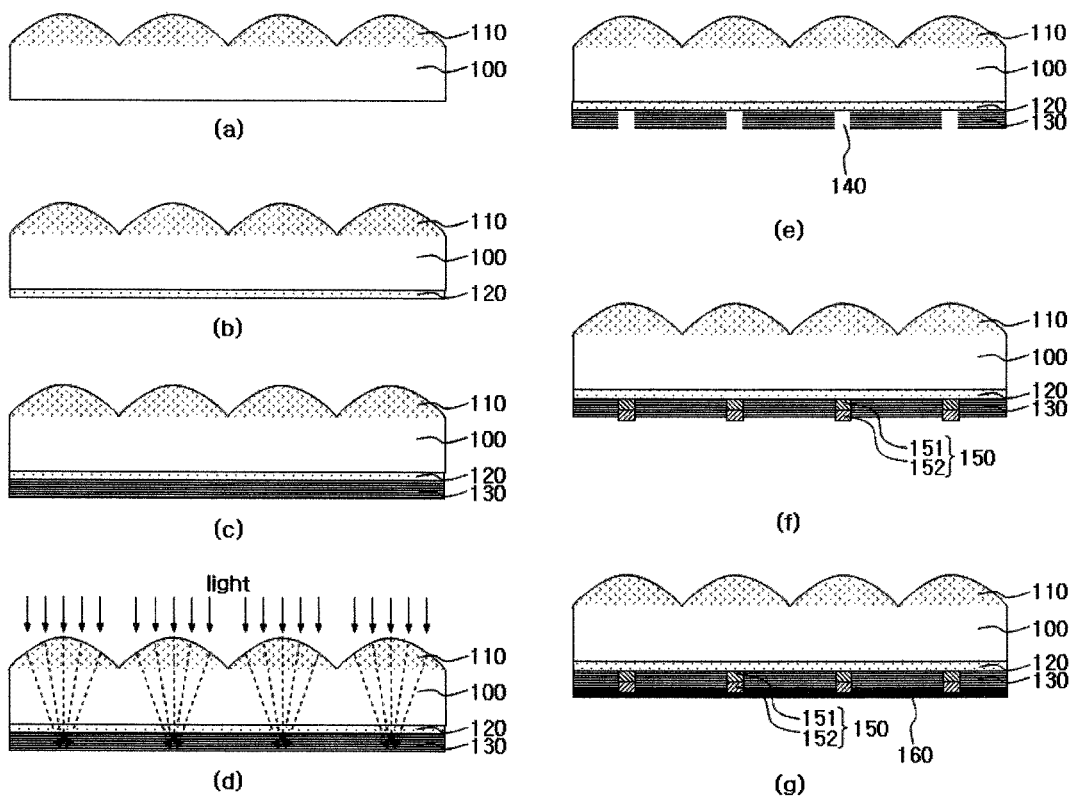
FIG. 13 shows a method of manufacturing the solar cell apparatus according to the first exemplary embodiment of the present invention.

FIG. 13 shows a method of manufacturing the solar cell apparatus according to the first exemplary embodiment of the present invention.

Referring to (a) of FIG. 13, a plate 100 having a plurality of convex lenses 110 on one surface is formed. To increase an effective light receiving area, the plurality of lenses 110 may have at least two different sizes. In the exemplary embodiment, the plurality of lenses are a plurality of convex lenses 110, which however may be replaced with a plurality of Fresnel lenses, a plurality of cylinder lenses, a plurality of flat panel-type lenses, or a combination thereof, and may have different sizes. If the focal distances are similar, the lenses may have different shapes, and there is no size limit for the lenses. The plurality of convex lenses 110 and the plate 100 have light transmission properties. A light transmitting material may include glass or a polymer compound such as a polymer.

Referring to (b) of FIG. 13, a first electrode 120 electrically connecting a plurality of solar cells 150 is formed on an opposite surface of the surface of the plate 100 having the plurality of lenses 110.

The first electrode 120 may be formed of various conductive metals or a conductive organic compound such as a conductive polymer. The first electrode 120 may have light transmission properties. In this case, the first electrode having light transmission properties may be formed of a conductive polymer linked with ITO or carbon nanotubes. Meanwhile, the first electrode 120 may be deposited by chemical vapor deposition, printing, or physical deposition. The physical deposition may be performed by thermal evaporation or sputtering.

(c) of FIG. 13 shows a process of depositing an insulating layer 130 on the first electrode 120. The insulating layer 130 may be formed of various nitride layers, oxide layers, polymers or organic compounds having electrical insulation properties. The insulating layer 130 electrically isolates the first electrode 120 from the second electrode 160. In addition, the insulating layer 130 ensures spaces for respective solar cells 150. Meanwhile, the insulating layer 130 may be deposited by chemical vapor deposition or coating. The chemical vapor deposition may be low temperature chemical vapor deposition, plasma enhanced chemical vapor deposition, or low pressure chemical vapor deposition. The coating may be performed by dipping the plate having the first electrode in an insulating material, spraying an insulating material on the first electrode, or spin coating the insulating material on the first electrode. The insulating layer 130 may be formed of a photoresist. In addition, the photoresist may be a positive or negative resist.

(d) of FIG. 13 shows a process of exposing the insulating layer 130 using light passing through the plurality of lenses 110. In this case, the insulating layer 130 is formed of a photoresist, and particularly, a positive resist in (d) of FIG. 13. However, the photoresist may be a negative resist. Accordingly, without a separate mask and photoresist application for selective exposure, spaces 140 for the plurality of solar cells 150 may be ensured, which is called "automatic exposure."

According to the process of ensuring the spaces 140 for the plurality of solar cells 150 by automatic exposure, after depositing or coating the insulating layer 130 and performing soft baking, the entire surface of the plate 100 on which the plurality of solar cells 150 are arranged is exposed to light. The light may be an ultraviolet (UV) light, but the present invention is not limited thereto. When the insulating layer is formed of a photoresist, and particularly, a positive resist, the exposed region is removed by subsequent development, and the spaces for the plurality of solar cells 150 may be formed by hard baking to stabilize the photoresist.

(e) of FIG. 13 shows the spaces 140 for the plurality of solar cells 150 formed by a process of ensuring the spaces 140 for the plurality of solar cells 150.

(f) of FIG. 13 shows a process of disposing the plurality of solar cells 150 on the other surface of the plate 100, which may be performed by automatic assembly or manual assembly. The manual assembly may be performed by a surface mounting technique or human power. The automatic assembly may be fluidic self-assembly. The surface mounting technique of the manual assembly may be an automatic mounting technique generally used for a semiconductor chip. The fluidic self-assembly of the automatic assembly refers to a method of automatically disposing the solar cells 150 in the spaces 140 for the solar cells 150 by flowing solar cell units in a fluid. In other words, the fluidic self-assembly can be performed by matching up a recess of the space with the shape of a unit of the solar cell. (e) of FIG. 13 shows an example using a difference in physical height. A pattern of the spaces 140 may be made by the difference in physical height, or the difference in chemical property such as hydrophilicity versus hydrophobicity.

(g) of FIG. 13 shows a process of forming a second electrode 160 for electrically connecting the plurality of solar cells 150. The second electrode 160 may be formed of various conductive metals or organic compounds such as a conductive polymer. The second electrode 160 may have light transmission properties. In this case, the second electrode having the light transmission properties may be formed of a conductive polymer linked to ITO or carbon nanotubes. Meanwhile, the second electrode 160 may be deposited by chemical vapor deposition, printing or physical deposition. The physical deposition may be performed by thermal deposition or sputtering.

Figure 14:
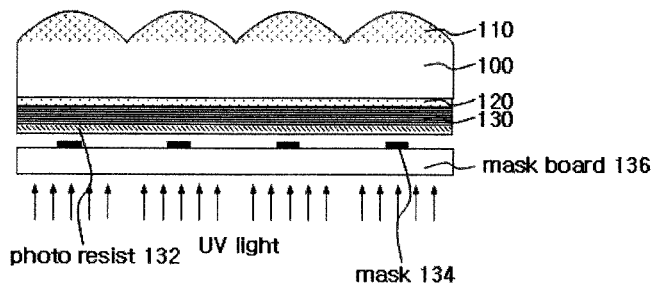
FIG. 14 shows a modified example of (d) of FIG. 13.

FIG. 14 shows a modified example of (d) of FIG. 13.

FIG. 14 shows a process of ensuring spaces 140 for a plurality of solar cells 150 using separate photoresist application and a separate mask, unlike the automatic exposure. After a photoresist 132 is applied to the insulating layer 130 and soft baking is performed, selective exposure is performed on the spaces 140 for the plurality of solar cells 150 using a mask 134 on a mask board 136. In FIG. 14, a negative resist is used, but it may be replaced with a positive resist. In this case, a shape of a mask pattern needs to be manufactured for light to be transmitted with respect to the spaces 140 for the plurality of solar cells 150 and to be blocked with respect to the other spaces. The insulating layer may not have photosensitivity. Afterwards, as the photoresist in the region which may not be exposed by development may be removed, and the insulating layer may be removed by dry or wet etching after hard baking, the spaces 140 for the plurality of solar cells 150 can be completed. The remaining photoresists 132 may be removed by a dry or wet method.

The other processes to manufacture the solar cell apparatus are the same as described in the first exemplary embodiment.

Figure 15:
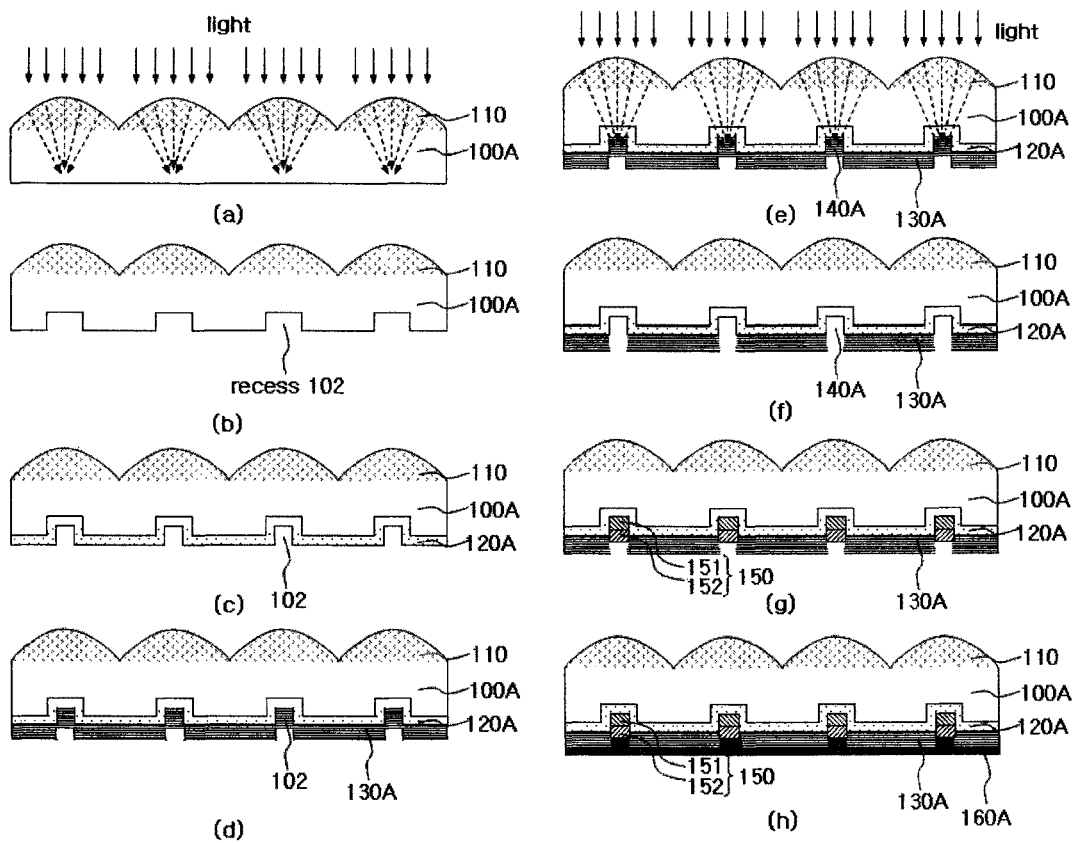
FIG. 15 shows a method of manufacturing the solar cell apparatus according to the second exemplary embodiment of the present invention.

FIG. 15 shows a method of manufacturing the solar cell apparatus according to the second exemplary embodiment of the present invention.

According to the method of manufacturing the solar cell apparatus shown in FIG. 15, when the focal distances of a plurality of lenses are less than the height of the plate, concave recesses 102 are formed in the plate, which is the difference from the method of manufacturing the solar cell apparatus according to the first exemplary embodiment as shown in FIG. 13.

Referring to (a) of FIG. 15, the focal distances of the plurality of lenses 110 are less than the height of the plate 100A, and thus the focuses are placed inside the plate 100A.

(b) of FIG. 15 shows a configuration of the plate 100A having concave recesses 102 for the focuses of the plurality of lenses 110 to be placed on the plurality of solar cells 150.

(c) to (h) of FIG. 15 show a process of forming a first electrode 120A on the plate 100A, a process of forming an insulating layer 130A, a process of forming spaces 140A for the plurality of solar cells 150, a process of placing the plurality of solar cells 150, and a process of forming a second electrode 160A. Detailed processes or materials are the same as those described in the method of manufacturing the solar cell according to the first exemplary embodiment shown in FIG. 13, and the detailed descriptions thereof will be omitted for convenience.

Figure 16:
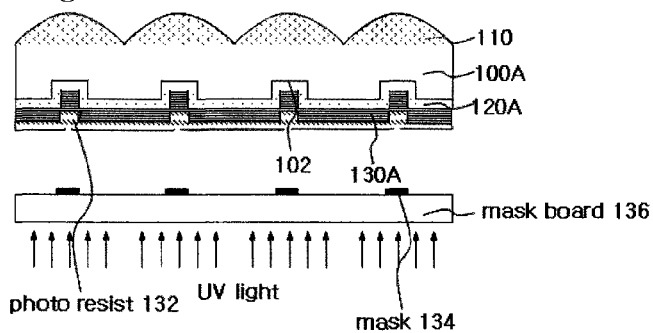
FIG. 16 shows a modified example of (e) of FIG. 15.

FIG. 16 shows a modified example of (e) of FIG. 15.

FIG. 16 shows a method of using a mask 134 formed on a light transmitting mask board 136 and a photoresist 132 to form spaces 140A for the plurality of solar cells 150. Detailed processes or materials are the same as those described in the method of manufacturing the solar cell according to the first exemplary embodiment shown in FIG. 14, and the detailed descriptions thereof will be omitted for convenience.

The other processes of manufacturing the solar cell apparatus are the same as described in the first exemplary embodiment.

Figure 17:
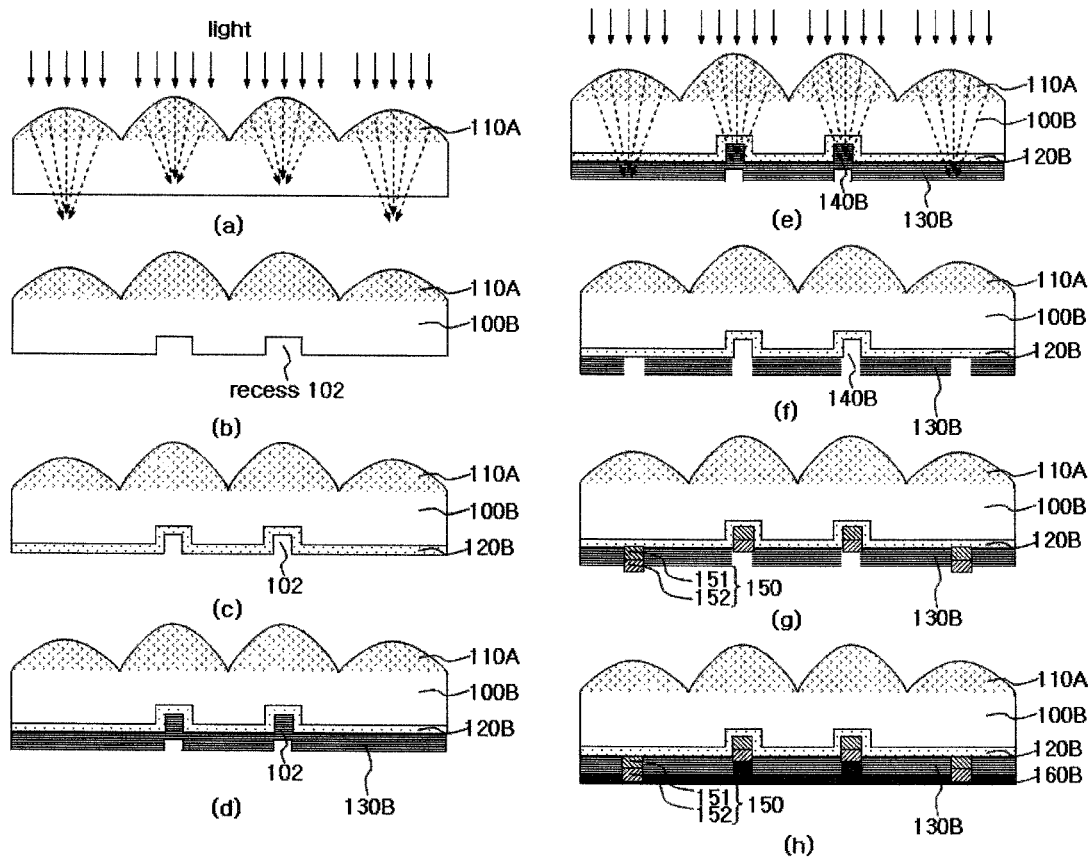
FIG. 17 shows a method of manufacturing the solar cell apparatus according to the third exemplary embodiment of the present invention.

FIG. 17 shows a method of manufacturing the solar cell apparatus according to the third exemplary embodiment of the present invention.

According to the method of manufacturing the solar cell apparatus of FIG. 17, when the focal distances of at least some of a plurality of lenses are less than the height of a plate, concave recesses 102 are formed in some parts of the other side of the plate 100B, which is the difference from the methods of manufacturing the solar cell apparatus according to the first and second exemplary embodiments shown in FIGS. 13 and 15.

Referring to (a) of FIG. 17, the focal distances of at least some of the plurality of lenses 110 are less than the height of the plate 100B, and thus the focuses of the lenses are placed inside the plate 100B.

(b) of FIG. 17 shows a configuration of the plate 100B having concave recesses 102 for the focuses of the plurality of lenses 110A to be placed on a plurality of solar cells 150.

(c) to (h) of FIG. 17 show a process of forming a first electrode 120B on the plate 100B, a process of forming an insulating layer 130B, a process of forming spaces 140B for the plurality of solar cells 150, a process of placing the plurality of solar cells 150, and a process of forming a second electrode 160B. Detailed processes or materials are the same as those described in the method of manufacturing the solar cell according to the first exemplary embodiment shown in FIG. 13, and the detailed descriptions thereof will be omitted for convenience.

Figure 18:
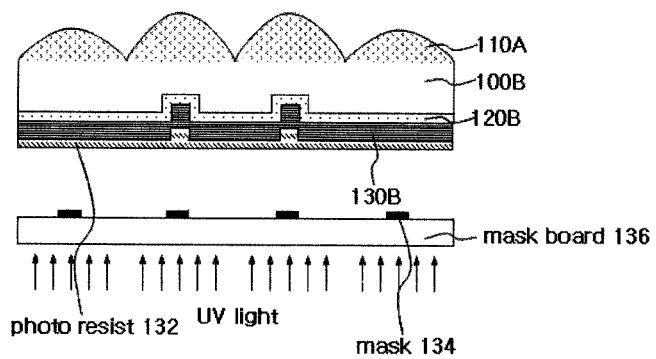
FIG. 18 shows a modified example of (e) of FIG. 17.

FIG. 18 shows a modified example of (e) of FIG. 17.

FIG. 18 shows a method of using a mask 134 formed on a light transmitting mask board 136 and a photoresist 132 to form spaces 140B for the plurality of solar cells 150. Detailed processes or materials are the same as those described in the modified method of manufacturing the solar cell according to the first exemplary embodiment shown in FIG. 14, and the detailed descriptions thereof will be omitted for convenience.

The other processes of manufacturing the solar cell apparatus are the same as described in the first exemplary embodiment.

FIG. 19 shows a method of manufacturing the solar cell apparatus according to the fourth exemplary embodiment of the present invention.

Referring to (a) of FIG. 19, a plate 100 on which a plurality of convex lenses 110 are formed is prepared. To increase an effective light receiving area, the plurality of lenses 110 may have at least two different sizes. In the exemplary embodiment, the plurality of lenses are a plurality of convex lenses 110, which may be replaced with a plurality of Fresnel lenses, cylinder lenses, flat panel-type lenses, or a combination thereof. In addition, the lenses may have different sizes. If the focal distances are similar, the lenses may have different shapes, and there is no size limit for the lenses.

Referring to (b) of FIG. 19, a plurality of first electrodes 120C insulated from each other to electrically connect a plurality of solar cells 150 on an opposite surface of the surface of the plate having the plurality of lenses 110. After deposition of the first electrodes according to the first exemplary embodiment, general photolithography using a photoresist and etching are performed on the first electrodes, and thus the plurality of first electrodes 120C can be completed.

(c) of FIG. 19 shows a process of depositing an insulating layer 130C on the plurality of first electrodes 120C. The insulating layer 130C serves to electrically isolate the plurality of first electrodes 120C from a plurality of second electrodes 160C, and serves as a pathway to make an electrically serial connection with the solar cells 150 through contact holes 142. In addition, the insulating layer 130C ensures spaces for respective solar cells 150.

(d) of FIG. 19 shows a process of exposing the insulating layer 130C using light passing through the plurality of lenses 110. In this case, the insulating layer 130C is formed of a photoresist, and particularly, a positive resist. However, the insulating layer 130C may be formed of a negative resist.

(e) of FIG. 19 shows spaces 140C for the plurality of solar cells 150 formed in a process of ensuring the spaces 140C for the plurality of solar cells 150.

(f) of FIG. 19 shows a process of ensuring contact holes 142 to be used to connect the plurality of solar cells 150 in series.

After a photoresist 132 is applied to the insulating layer 130C and soft baking is performed, selective exposure is performed on spaces for the contact holes 142 using a mask 134A on a mask board 136.

(g) of FIG. 19 shows a process of disposing the plurality of solar cells 150. Two successive solar cells of the plurality of solar cells 150 connected in series are referred to as a first solar cell 150A and a second solar cell 150B, respectively. Among these, the first solar cell 150A is connected by a first electrode 122C of the plurality of first electrodes 120C.

(h) of FIG. 19 shows a process of forming a plurality of second electrodes 160C insulated from each other to electrically connect the plurality of solar cells 150. The second solar cell 150B is connected by a second electrode 162C of the plurality of second electrodes 160C. The first and second electrodes 122C and 162C are connected with each other through a corresponding contact hole 142A of the plurality of contact holes 142 such that the solar cells are electrically connected in series. Meanwhile, in (h) of FIG. 19, the contact holes 142 are simultaneously formed with the second electrodes 160C, but each of the contact holes 142 may be deposited by chemical vapor deposition, printing or physical deposition. Detailed processes or materials are the same as described in the method of manufacturing a solar cell according to the first exemplary embodiment of FIG. 13, and thus the detailed description thereof will be omitted for convenience.

The other processes of the method of manufacturing a solar cell apparatus are the same as described in the first exemplary embodiment.

FIG. 20 shows a modified example of (d) to (f) of FIG. 19.

FIG. 20 shows a method using a mask 134B formed on a light transmitting mask board 136 and a photoresist 132 to form the spaces 140C for the plurality of solar cells 150 and contact holes 142. Detailed processes or materials are the same as described in the method of manufacturing the solar cell according to the first exemplary embodiment of FIG. 13, and thus the detailed description thereof will be omitted for convenience.

The other processes of the method of manufacturing the solar cell apparatus are the same as described in the first exemplary embodiment.

FIG. 21 shows a method of manufacturing the solar cell apparatus according to the fifth exemplary embodiment of the present invention.

Referring to (a) of FIG. 21, a plate 100 on which a plurality of convex lenses 110 are formed is prepared. To increase an effective light receiving area, the plurality of lenses 110 may have at least two different sizes. In the exemplary embodiment, the plurality of lenses are a plurality of convex lenses 110, which may be replaced with a plurality of Fresnel lenses, cylinder lenses, flat panel-type lenses, or a combination thereof. In addition, the lenses may have different sizes. If the focal distances are similar, the lenses may have different shapes, and there is no size limit for the lenses.

Referring to (b) of FIG. 21, a plurality of first electrodes 120D insulated from each other are formed to electrically connect a plurality of solar cells 150 on the other surface of the plate having the plurality of lenses 110 on one surface. After deposition of the first electrodes according to the first exemplary embodiment, general photolithography using a photoresist and etching are performed on the first electrodes, and thus the plurality of first electrodes 120D can be completed.

(c) of FIG. 21 shows a process of depositing an insulating layer 130D on the plurality of first electrodes 120D. The insulating layer 130D serves to electrically isolate the plurality of first electrodes 120D from a plurality of second electrodes 160D, and ensure respective spaces for the solar cells 150.

(d) of FIG. 21 shows a process of exposing the insulating layer 130D using light passing through the plurality of lenses 110. In this case, the insulating layer 130D is formed of a photoresist, and particularly, a positive resist. However, the insulating layer 130D may be formed of a negative resist.

(e) of FIG. 21 shows spaces 140D for the plurality of solar cells 150 formed in a process of ensuring the spaces 140D for the plurality of solar cells 150.

(f) of FIG. 21 shows a process of arranging the plurality of solar cells 150.

Three successive solar cells of the plurality of solar cells 150 connected in series are referred to as first, second, and third solar cells 150C, 150D, and 150E, respectively. The first and second solar cells 150C and 150D are connected by a corresponding first electrode 122D of the plurality of first electrodes 120D.

(g) of FIG. 21 shows a process of forming a plurality of second electrodes 160D insulated from each other to electrically connect the plurality of solar cells 150. The second and third solar cells 150D and 150E are connected by a corresponding second electrode 162D of the plurality of second electrodes 160D such that the solar cells 150 arranged in different polarity directions are electrically connected in series. Detailed processes or materials are the same as described in the method of manufacturing a solar cell according to the first exemplary embodiment of FIG. 13, and thus the detailed description thereof will be omitted for convenience.

The other processes of the method of manufacturing a solar cell apparatus are the same as described in the first exemplary embodiment.

FIG. 22 shows a modified example of (d) of FIG. 21.

FIG. 22 shows a method using a mask 134 formed on a light transmitting mask board 136 and a photoresist 132 to form the spaces 140D for the plurality of solar cells 150 and contact holes 142. Detailed processes or materials are the same as described in the modified example of the method of manufacturing a solar cell according to the first exemplary embodiment shown in FIG. 14, and thus the detailed description thereof will be omitted for convenience.

The other processes of the method of manufacturing a solar cell apparatus are the same as described in the first exemplary embodiment.

Figure 23:
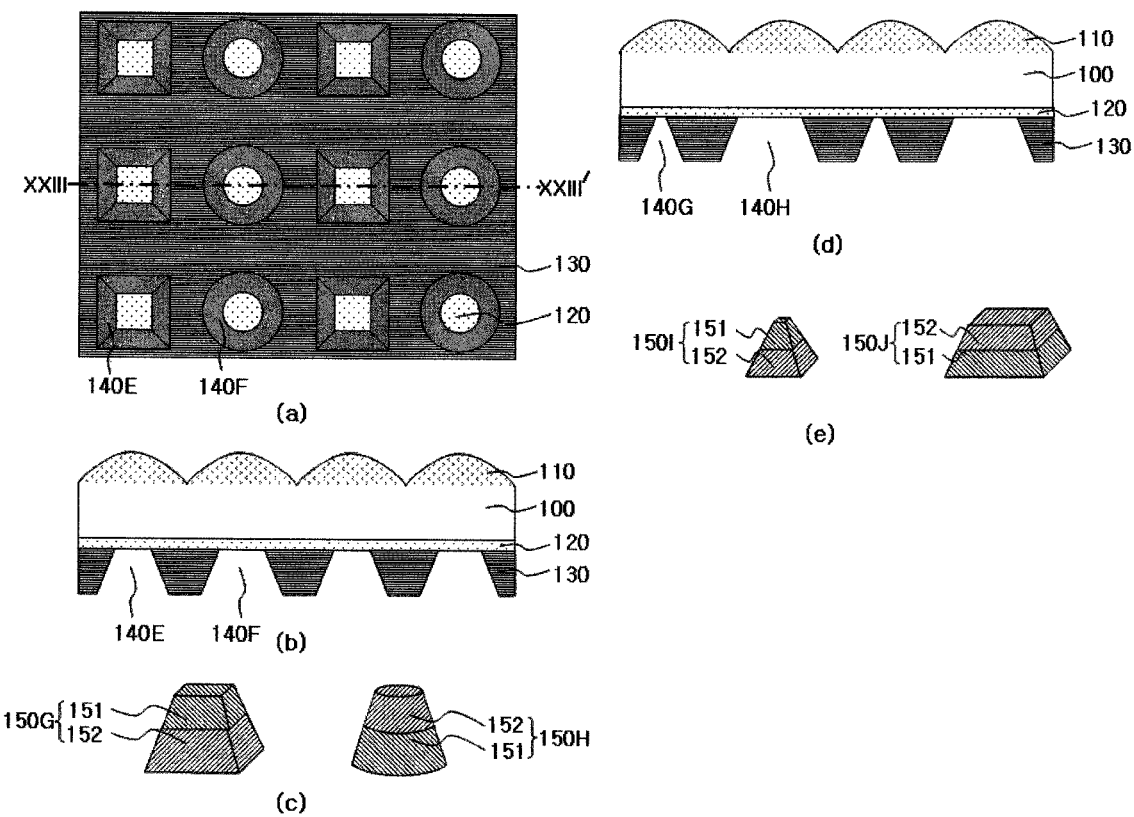
FIG. 23 shows self-assembly of solar cells.

FIG. 23 shows self-assembly of the solar cells 150.

(a) and (b) of FIG. 23 are plan and cross-sectional views of the opposite surface a plate 100 having the microlenses 110 on one surface. On the other surface of the plate 100, a first electrode 120 and an insulating layer 130 in which spaces 140E and 140F for the solar cells 150 are formed may be further included. (c) of FIG. 23 shows solar cells 150G and 150H arranged in different polarity directions and having different shapes. (d) of FIG. 23 shows the first electrode 120 formed on an opposite surface and the insulating layer 130 having spaces 140G and 140H for the solar cells 150 having different sizes. (e) of FIG. 23 shows solar cells 150I and 150J changed in polarity direction and shape.

Referring to (a) and (b) of FIG. 23, the spaces 140E and 140F for the solar cells 150 have recesses having different shapes, for example, tetragonal and circular recesses 140E (first shape) and 140F (second shape), respectively. Therefore, the solar cell 150G formed in a third shape corresponding to the first-shape recess 140E is connected to the recess having the first shape 140E, and the solar cell 150H formed in a fourth shape corresponding to the second-shape recess 140F is connected to the recess having the second shape 140F. In other words, the solar cells are connected to the recesses having corresponding shapes. In the exemplary embodiment, the solar cells are formed in square pillar and cylinder shapes, respectively, but the solar cells may have various shapes and sizes as long as the mutually exclusive coupling between the solar cell and the recess is possible. Further, in FIG. 23, each solar cell 150 has a different shape. However, there may be a plurality of the solar cells 150 having the same shape, each of which may be connected to any space having the same shape.

(b) of FIG. 23 is a cross-sectional view of the insulating layer 130 having spaces 140E and 140F for the solar cells 150 on the opposite surface of the plate 100. In the exemplary embodiment, the bottom of a pattern is formed in circular and tetragonal shapes, but it may be a circular, square, or other polygonal shape, or a combination of circular and polygonal shapes.

To obtain patterns having various shapes, when the insulating layer 130 is formed of a photoresist, microlenses may be changed in shape to focus various images, and automatic exposure may be performed. However, when conventional photolithography and etching are used, the same effect as described above can be obtained by changing the shape of a mask in a circular, tetragonal, or polygonal shape, or a combination thereof.

(c) of FIG. 23 shows solar cells 150G and 150H changed in polarity direction and shape. In detail, (c) of FIG. 23 shows the solar cell 150G having a third shape corresponding to the first-shape 140E, and the solar cell 150H having a fourth shape corresponding to the second-shape. In the exemplary embodiment, P(151)-N(152) junction solar cells 150 having different polarity directions are shown. The exemplary embodiment shows solar cells, which may be replaced with other electronic devices. In this case, electronic devices can be mutually exclusively arranged in desired places depending on the shape and size.

According to such a method described above, the solar cells having different shapes and sizes can be precisely assembled in spaces corresponding to the sizes of the solar cells, so that the solar cells having specific polarity may be selectively disposed in desired places. A method of flowing solar cells in a fluid to place them in places having corresponding sizes is referred to as "fluidic self-assembly." (b) of FIG. 23 shows an example using the difference in physical height. A pattern of the spaces 140E and 140F may be created by the difference in physical height, or the difference in chemical property such as hydrophilicity versus hydrophobicity. In the exemplary embodiment, the bottom of the pattern is formed in circular and tetragonal shapes, but it may be formed in various polygonal shapes or a combination of circular and polygonal shapes.

(b) of FIG. 23 shows a method of self-assembling the solar cells 150 of the solar cell apparatus, which are arranged in the same polarity direction and electrically connected in parallel in FIG. 13 (in this case, the solar cells 150 have the same polarity direction regardless of the shape). However, the self-assembly can also be applied to the method of manufacturing the solar cell apparatus in which the solar cells 150 arranged in the same polarity direction are electrically connected in series according to the fourth exemplary embodiment in FIG. 19 or the method of manufacturing the solar cell apparatus in which at least some of the solar cells 150 are arranged in different polarity directions but the solar cells are electrically connected in series according to the fifth exemplary embodiment in FIG. 21.

(d) and (e) of FIG. 23 show a pattern of the spaces 140G and 140H changed in size and solar cells 150I and 150J changed in polarity direction and size, respectively. In the exemplary embodiment, the bottom of the pattern is formed in a tetragonal shape, but it may be formed in a circular or polygonal shape, or a combination of circular and polygonal shapes. The connections between the spaces and the solar cells and self-assembly are the same as described in the detailed descriptions of (a) to (c) of FIG. 23, and thus the detailed description thereof will be omitted for convenience. Hereinafter, detailed processes or materials are the same as described in the method of manufacturing a solar cell according to the first exemplary embodiment of FIG. 13, and thus the detailed description thereof will also be omitted for convenience.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A solar cell apparatus, comprising:
a plate having a first surface on which a plurality of lenses are arranged, a second surface opposite to the first surface, and a plurality of concave recesses formed on the second surface;
an insulating layer formed under the second surface of the plate; and
a plurality of solar cells receiving light concentrated by the plurality of lenses,
wherein the plurality of lenses includes a first lens having a first focus positioned in a concave recess of the plurality of concave recesses and a second lens having a second focus positioned in the insulating layer,
wherein the plurality of solar cells includes i) a first solar cell seated in the concave recess in which the first focus is positioned such that the light passing through the first lens and the plate is concentrated on the first solar cell, and ii) a second solar cell positioned at the second focus in the insulating layer such that the light passing through the second lens and the plate is concentrated on the second solar cell.

2. The apparatus of claim 1, wherein the plate provides a focal distance such that focuses of the plurality of lenses are placed on the plurality of solar cells.

3. The apparatus of claim 1, wherein the plurality of solar cells include inorganic solar cells.

4. The apparatus of claim 1, wherein the plurality of lenses include convex lenses.

5. The apparatus of claim 1, wherein the plurality of solar cells are connected in parallel.

6. The apparatus of claim 5, further comprising:
a first electrode placed on the second surface of the plate;
the insulating layer disposed on the first electrode and surrounding the plurality of solar cells; and
a second electrode disposed on the insulating layer and the plurality of solar cells,
wherein the plurality of solar cells are disposed in the same polarity direction as the second surface of the plate.

7. The apparatus of claim 1, wherein at least some of the plurality of solar cells are connected in series.

8. The apparatus of claim 7, further comprising:
a plurality of first electrodes insulated from each other and placed on the second surface of the plate;
the insulating layer disposed on the plurality of first electrodes and surrounding the plurality of solar cells, the insulating layer having a plurality of contact holes; and
a plurality of second electrodes insulated from each other and disposed on the insulating layer and the plurality of solar cells, wherein the plurality of solar cells are disposed in the same polarity direction as the second surface of the plate, two successive solar cells of the plurality of solar cells connected in series (hereinafter, a first cell and a second cell) are connected to each other through a first electrode connected to the first cell of the plurality of first electrodes and a second electrode connected to the second cell of the plurality of second electrodes, the first and second electrodes being connected to each other through a corresponding one of the plurality of contact holes.

9. The apparatus of claim 7, further comprising:

a plurality of first electrodes insulated from each other and placed on the second surface of the plate;

the insulating layer disposed on the plurality of first electrodes and surrounding the plurality of solar cells; and a plurality of second electrodes insulated from each other and disposed on the insulating layer and the plurality of solar cells, wherein two successive ones of the plurality of solar cells connected in series are disposed in different polarity directions, and among three successive solar cells of the plurality of solar cells connected in series (hereinafter, a first cell, a second cell, and a third cell), the first and second cells are connected to each other by a corresponding first electrode of the plurality of first electrodes, and the second and third cells are connected to each other by a corresponding second electrode of the plurality of second electrodes.

10. The apparatus of claim 7, wherein at least some of the serially connected solar cells include at least two solar cells having the same polarity direction, which are connected in parallel.

* * * * *